United States Patent [19]

Kooi

[11] 3,873,383

[45] Mar. 25, 1975

[54] INTEGRATED CIRCUITS WITH OXIDATION-JUNCTION ISOLATION AND CHANNEL STOP

[75] Inventor: Else Kooi, Emmasingel, Eindhoven, Netherlands

[73] Assignee: U.S. Philips Corporation, New York, N.Y.

[22] Filed: Jan. 28, 1974

[21] Appl. No.: 437,005

Related U.S. Application Data

[62] Division of Ser. No. 238,784, March 28, 1972, abandoned.

[52] U.S. Cl. .................... 148/187, 148/173, 357/41, 357/48, 357/49

[51] Int. Cl. .............................................. H01l 7/44

[58] Field of Search ...................... 148/187; 317/235

[56] References Cited

UNITED STATES PATENTS

| | | | |
|---|---|---|---|
| 3,544,858 | 12/1970 | Kooi | 317/235 |
| 3,648,125 | 3/1972 | Peltzer | 317/235 |
| 3,718,843 | 2/1973 | Kooi | 317/235 |
| 3,751,722 | 8/1973 | Richman | 317/235 |

OTHER PUBLICATIONS

Doo et al., "Making Monolithic Semiconductor – – – ," IBM Tech. Discl. Bull. Vol. 8, No. 4, Sept. 65, pp. 659–660.

Maheux, "Transistor for Monolithic Circuits, " IBM Tech. Discl. Bull. Vol. 11, No. 12, May 69, pp. 1690–1691.

*Primary Examiner*—L. Dewayne Rutledge
*Assistant Examiner*—J. M. Davis
*Attorney, Agent, or Firm*—Frank R. Trifari; Jack Oisher

[57] ABSTRACT

A method of making a semiconductor device in a major surface of a semiconductive body having an inset pattern of insulating material and in which an additional doped zone is provided adjacent to the inset pattern. Prior to the provision of the inset pattern, providing an oxidation and impurity masking layer pattern with apertures at the areas where the inset pattern is to be formed, doping the body through the apertures and thereafter oxidizing the body portions through the apertures, thereby providing oxidation - junction isolation and channel stop.

7 Claims, 8 Drawing Figures

INTEGRATED CIRCUITS WITH OXIDATION-JUNCTION ISOLATION AND CHANNEL STOP

This is a division of application Ser. No. 238,784, filed Mar. 28, 1972, now abandoned.

The invention relates to a semiconductor device comprising a semiconductor body having at least one circuit element with at least three regions of which two regions have a first conductivity type and are separated by a region having a second conductivity type opposite to the first type, in which a pattern of insulating material is present which is inset in the semiconductor body and which extends in said body at least over a part of its thickness from a major surface of the semiconductor body, the semiconductor body has at least one layer-shaped part which adjoins the major surface and adjoins the inset pattern along its whole circumference and throughout its whole thickness, in which layer-shaped part one of the two regions of the first conductivity type and the region of the second conductivity type of the circuit element are provided entirely and the other one of the two regions of the first conductivity type is provided at least partly, while the other region, in so far as it is provided in the layer-shaped part, adjoins the inset pattern along its full circumference and the region of the second conductivity type, adjoins the inset pattern at least along a part of its circumference and the region of the second conductivity type is separated from the major surface at least partly by the one region.

The invention furthermore relates to a method of manufacturing the semiconductor device.

Such a semiconductor device in which the circuit element is a transistor is described in the Dutch Patent application No. 6,614,016 and has important advantages. For example, the p-n junction between the region of the second conductivity type serving as a base and the other region of the first conductivity type serving as a collector often does not terminate via a strong curvature near its edge substantially normal to the main surface, but is laterally bounded by the pattern while avoiding said curvature, and this has a favorable influence on the electric properties of the transistor, In manufacturing such a semiconductor device in an integrated circuit, starting material is often a high-ohmic semiconductor substrate of the p-type conductivity on which a semiconductor layer of the n-type conductivity is deposited epitaxially, if desirable after a source has been provided first on the substrate with a doping material which can cause the n-type conductivity in the semiconductor body to obtsin a so-called buried collector layer.

By local oxidation of the epitaxial layer, the inset pattern of insulating material is then formed and regions of the p- and of the n-conductivity type, namely the base and the emitter of the transistor, are then successively formed by diffusion in the layer-shaped part enclosed laterally by the pattern.

It has been found experimentally that during the formation of the inset pattern by oxidation of the epitaxial layer, the doping material which causes the n-type conductivity in the epitaxial layer is often incorporated only insufficiently by the formed oxide and is even forced into the substrate as a result of which this can be locally overdoped and channelling can occur between circuit elements in adjacent layer-shaped parts separated by the inset pattern.

Furthermore, a concentration of the doping material from the epitaxial layer at the boundary with the inset layer has for its result that upon diffusion of a base which adjoins the pattern along its whole circumference, an edge region of the base is less strongly of the p-type conductivity than is a central part of the base, In addition, doping materials which cause the p-type conductivity in the semiconductor material are often incorporated to a rather considerable extent by the inset pattern, as a result of which the base becomes thinner at least at the boundary with the inset pattern.

If subsequently an emitter of the n-type is diffused in the layer-shaped part, which emitter also extends up to the pattern, the edge region of the base is often overdoped as a result of which shortcircuit occurs between the emitter and the collector.

Such a shortcircuit easily occurs in certain processes to obtain the inset pattern as will be described in detail below.

The described problems of channelling and shortcircuit may also occur, for example, when the starting material is a p-type epitaxial layer on a p-type substrate. Channelling and shortcircuit may occur in this case in that n-type channels can be induced in p-type regions adjoining the oxide by positive charges in the oxide or at the interface semiconductor-oxide.

The said channelling is promoted in that instead of forcing the doping material into the epitaxial layer, the phenomenon just occurs that the doping material is absorbed to a considerable extent from the epitaxial layer by the forming oxide.

It is one of the objects of the invention to avoid the described problems of channelling and shortcircuit at least considerably.

The invention is based on the recognition of the fact that the described effects of the concentration of doping materials which cause the n-type conductivity, the concentration reduction of doping materials which cause the p-type conductivity, and of charges in the inset pattern can be compensated by an increase of the concentration of the last-mentioned doping materials in a zone adjoining the inset pattern.

According to the invention, the semiconductor device mentioned in the preamble therefore is characterized in that the inset pattern, at least at the area where it adjoins the layer-shaped part, in the semiconductor body is entirely embedded in an adjacent zone with a concentration of a doping material which can cause the second conductivity type, said concentration being smaller than the maximum concentration of the doping material causing the first conductivity type in the other of the two regions of the first conductivity type, said concentration being sufficiently large to prevent electric connection between regions of the first conductivity type in regions of the second conductivity type at the area of the zone. Doping material is to be understood to mean herein also a mixture of doping materials which cause the same conductivity type. With such an adjacent zone, overdoping of a semiconductor substrate during the oxidation of, for example, an epitaxial layer and channelling between layer-shaped parts separated by the pattern can be prevented and a so-called channel stopper be formed.

Therefore, the semiconductor device according to the invention preferably is an integrated circuit, the semiconductor body comprises a substrate and an epitaxial layer, the other of the two regions of the first conductivity type comprises a buried layer, and the concentration of the doping material in the adjoining zone is smaller than the concentration of the doping material causing the first conductivity type in the buried layer.

It will be obvious that in the semiconductor device according to the invention the zone adjoining the pattern and the said regions coincide partly.

In an important preferred embodiment of the semiconductor device according to the invention the concentration of the doping material causing the second conductivity type in the adjoining zone is smaller than the maximum concentration of the doping material causing the first conductivity type in the one of the two regions of the first conductivity type, and the one region adjoins the inset pattern at least over a part of its circumference. Due to the adjoining zone, shortcircuit between the two regions of the first conductivity type can be prevented.

The manufacture of the said preferred embodiment is comparatively simple, since no accurate alignment step relative to the region of the second conductivity type is necessary for providing the one region, and the mask opening for diffusion of the one region can even be partly laid over the pattern.

This again involves that no space need be reserved on the major surface for inaccuracies in the alignment step for providing the one region, as a result of which space is saved and the semiconductor device can be made smaller.

A further advantage of the said preferred embodiment is that the two p-n junctions between the regions of the circuit element can be substantially equally large. This permits more freedom in the choice as to which of the two regions of the first conductivity type may serve as the emitter and which as the collector of a transistor. The region of the second conductivity type may serve as the base.

The semiconductor device according to the invention may be constructed, for example, so that the one region adjoins the inset pattern over part of its circumference and that the region of the second conductivity type adjoins the major surface in two places separated from each other by the one region. As a result of this, for example, a bipolar transistor having two base contacts or a field effect transistor is obtained.

The semiconductor device according to the invention may alternatively be constructed so that multi-emitter or multi-collector systems are obtained.

In another embodiment, adjacent layer-shaped parts have a common region with a high concentration of a doping material, via which common circuit elements can be conductively connected in the adjacent layer-shaped parts. In order to obtain certain circuits, the common region in the one layer-shaped part may serve as the emitter and in the other layer-shaped part as the collector.

If the one region of the first conductivity type adjoins the inset pattern throughout its circumference, space will generally be reserved on the major surface for connecting the region of the second conductivity type.

If the concentration of the doping material causing the second conductivity type in the adjoining zone is larger than the maximum concentration of the doping material causing the first conductivity type in the one of the two regions of the first conductivity type, the zone adjoining the pattern may be provided at the major surface with a contact for the region of the second conductivity type.

A zone adjoining the pattern may elegantly be used for contacting a semiconductor body of the second conductivity type, for example of a substrate on which an epitaxial layer is provided.

For that purpose, the semiconductor body in a semiconductor device according to the invention preferably has another layer-shaped part which adjoins the major surface and which adjoins a part of the inset pattern at least along a part of its circumference and throughout its thickness, the said part of the inset pattern in the semiconductor body is entirely embedded in an adjoining zone having a concentration of a doping material which causes the second conductivity type at least in the part of the adjoining zone which is situated in the other layer-shaped part, and the semiconductor body is contacted at the major surface via the part of the adjoining zone in the other layer-shaped part.

The invention also relates to a method of manufacturing a semiconductor device comprising a semiconductor body having at least one circuit element with at least three regions of which two regions have a first conductivity and are separated by a region having a second conductivity type opposite to the first type, in which a pattern of insulating material is present which is inset in the semiconductor body and which extends in said body at least over a part of its thickness from a major surface of the semiconductor body, the semiconductor body has at least one layer-shaped part which adjoins the major surface and adjoins the inset pattern along its whole circumference and throughout its whole thickness, in which layer-shaped part one of the two regions of the first conductivity type and the region of the second conductivity type of the circuit element are provided entirely and the other of the two regions of the first conductivity type is provided at least partly, while the other region, in so far as it is provided in the layer-shaped part, adjoins the inset pattern along its whole circumference and the region of the second conductivity type adjoins the said inset pattern at least along a part of its circumference and the region of the second conductivity type is separated from the major surface at least partly by the one region, an oxidation-resistant masking layer having apertures at the area where the pattern is to be formed by oxidation being provided on the major surface, after which the pattern is formed by oxidation, characterized in that the semiconductor body is subjected to a treatment in which a doping material which can cause the secondary conductivity type in the semiconductor body is diffused in a zone adjoining the pattern and the concentration of the doping material in the zone is smaller than the maximum concentration of the doping material causing the first conductivity type in the other of the two regions of the first conductivity type, said concentration being sufficiently large to prevent electric connection between regions of the first conductivity type in regions of the second conductivity type at the area of the zone.

The method according to the invention is preferably carried out so that the masking layer is first used for masking during the diffusion of the doping material which can cause the second conductivity in the semiconductor body to obtain a doping pattern, after which the masking layer is used for masking during oxidation of the doping pattern to obtain the inset pattern and the adjoining zone of the second conductivity type.

In this method the inset pattern consists of oxide of the semiconductor material, for example silicon oxide. The oxidation-resistant masking layer consists, for example, of silicon nitride or of a double layer of silicon oxide and silicon nitride which, besides against oxidation, also masks against diffusion. In the choice of the concentration of the doping material in the doping pattern, the distribution of said doping material between the oxide pattern to be formed and the semiconductor material and the desirable concentration of the doping material in the various embodiments of the semiconductor device to be manufactured should of course be taken into account.

One is not restricted to the diffusion of the doping to obtain the adjoining zone preceding the oxidation.

The method according to the invention is therefore preferably carried out so that first the pattern is formed by oxidation and the zone of the second conductivity type adjoining the pattern is subsequently obtained by diffusion of aluminum or gallium as a doping material which can cause the second conductivity type. In this variation the fact is used that aluminum and gallium can diffuse comparatively rapidly through silicon oxide.

When gallium or aluminum is used as a doping material which can cause the second conductivity type, the oxidation-resistant masking layer may be used. These doping materials are preferably diffused after removing the masking layer. It will be obvious that in this case only embodiments of the semiconductor device according to the invention are manufactured in which the concentration of the gallium and/or the aluminum in the adjacent zone is smaller than the maximum concentration of the doping material causing the first conductivity type in the one of the two regions of the first conductivity type. Aluminum or gallium is preferably diffused after the one region of the first conductivity type has been formed in the semiconductor body.

The diffusion of the adjacent zone may be carried out simultaneously and with the same doping materials as a diffusion to obtain preferably a region of the second conductivity type, for example, a base region or a contact region of, for example, a semiconductor body, In order that the invention may be readily carried into effect a few embodiments thereof will now be described in greater detail, by way of example, with reference to the accompanying drawings, in which.

Figure 1:
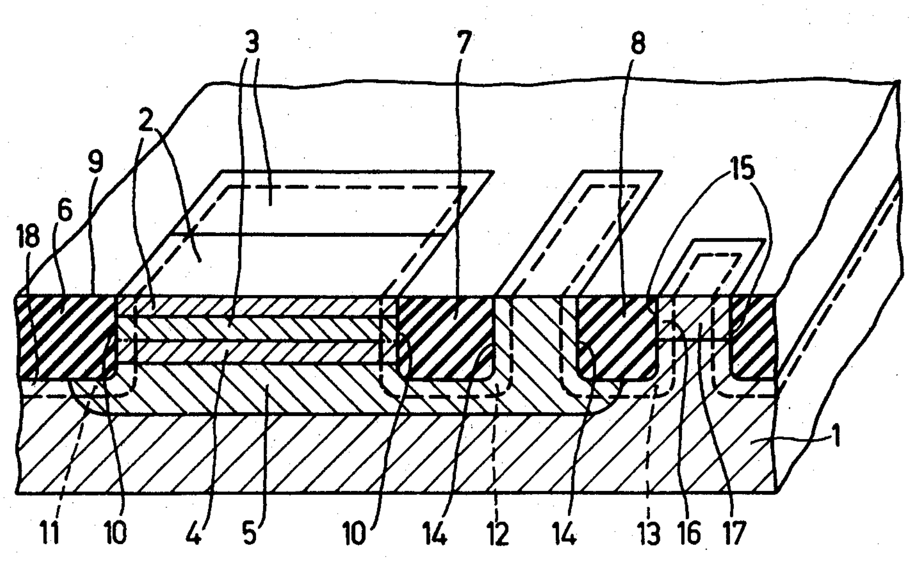
FIG. 1 is a diagrammatic partial crosssectional view and a partial perspective view of a part of an embodiment of the semiconductor device according to the invention.

The first example of a semiconductor body to be described is an integrated circuit a part of which is shown in FIG. 1. It comprises a semiconductor body 1 of the p-conductivity type comprising as a circuit element a transistor having two regions 2 and (4, 5) of the n-conductivity type separated by a region 3 of the p-conductivity type.

An inset pattern (6, 7, 8) of insulating material is present in the semiconductor body 1 and extends from a major surface 9 of the semiconductor body 1 in said body. The semiconductor body has a layer-shaped part 10 which adjoins the major surface 9 and adjoins the inset pattern (6, 7) along its whole circumference and throughout its whole thickness. In the layer-shaped part 10 one of the two regions of the n-conductivity type, namely the region 2, and the region of the p-conductivity type 3 are provided entirely and the other of the two regions of the n-conductivity type, namely the region (4, 5), is provided partly. The region (4, 5) in so far as it is provided in the layer-shaped part 10 adjoins the inset pattern (6, 7) as well as the region 3 of the p-conductivity type along its whole circumference. The region 3 is separated partly from the major surface 9 by the one region 2.

According to the invention, the inset pattern (6, 7, 8) in the semiconductor body is entirely embedded in an adjacent or additional (11, 12, 13) having a concentration of a doping material which can cause the p-conductivity type, which concentration is smaller than the maximum concentration of the doping material causing the n-conductivity type in the other (4, 5) of the two regions of the n-conductivity type. The concentration is also sufficiently large to prevent electric connection between regions of the n-conductivity type in regions (3, 1) of the p-conductivity type at the area of the zone (11, 12, 13), for example between the regions 2 and (4, 5).

In FIG. 1 the boundary of the zone (11, 12, 13) in the semiconductor body is denoted partly in a solid and partly in a broken line. In the case of a broken line, the conductivity type of the regions is not varied by the presence of the zone, in the case of a solid line it is varied indeed. So in this example the region 3 of the p-conductivity type is extended as it were by an edge of a part 4 of the other (4, 5) of the two regions of the n-conductivity type. The part 18 of the adjacent zone 11 serves as a channel stopper with respect to a circuit element not shown in an adjacent layer-shaped part. Layer-shaped parts can be isolated from each other by means of such channel stoppers.

In the embodiment shown in FIG. 1, the concentration of the doping material causing the p-conductivity type in the adjacent zone (11, 12, 13) is smaller than the maximum concentration of the doping material causing the n-conductivity type in the one of the two regions of the n-conductivity type, namely in the region 2, and the region 2 adjoins the inset pattern (6, 7) over a part of its circumference.

The regions 2 and 3 can be contacted at the major surface 9 on the layer-shaped part 10, while the region (4, 5) can be contacted at the major surface on a second layer-shaped part 14.

The adjoining zone can be used elegantly for contacting a semiconductor body of the p-conductivity type of the semiconductor device at the major surface. The semiconductor body has another layer-shaped part 15 which adjoins the major surface 9 and which adjoins a part 8 of the inset pattern at least along a part of its circumference and throughout its thickness. The said part 8 is fully embedded in the semiconductor body in an adjacent zone 13. The zone 13 has a concentration of a doping material which causes the p-conductivity type in the part 16 of the adjoining zone 13. Via the part 16 of the adjoining zone 13 in the other layer-shaped part 15, the semiconductor body 1 is contacted at the major surface 9. Contacting is carried out, for example, on a low-ohmic contact zone 17 of the p-conductivity type.

Figure 2:
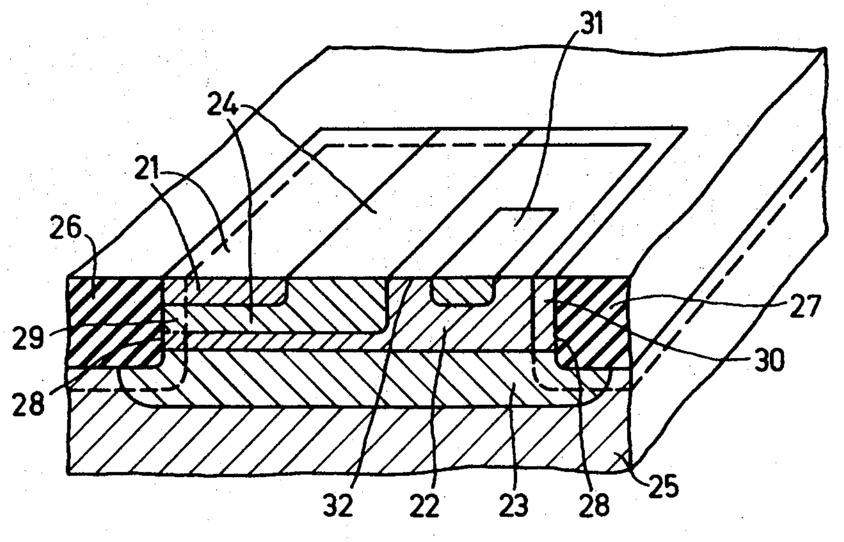
FIG. 2 is a diagrammatic partial crosssectional view and partial perspective view of a part of another embodiment of the semiconductor device according to the invention.

The second embodiment of a aluminum device according to the invention as is shown in FIG. 2 will now be described briefly. In this embodiment also the circuit element is a transistor. The semiconductor body 25 comprises an inset pattern 26, 27, a layer-shaped part 28 in which the regions 21 and (22, 23) of the n-type (the latter partly), and the region 24 of the p-type of the transistor are present.

The inset pattern 26, 27 is embedded in an adjacent zone (29, 30) in the same manner as described in the preceding embodiment. In this embodiment the region 24 of the p-type adjoins the inset pattern 26 only over a part of its circumference, as a result of which the other region (22, 23) in the layer-shaped part 28 is contacted, if desirable, by means of a low-ohmic contact zone 31 of the n-type.

In a corresponding manner as in the preceding embodiment, the semiconductor body in this case also may be contacted at the major surface 32.

Figure 3:
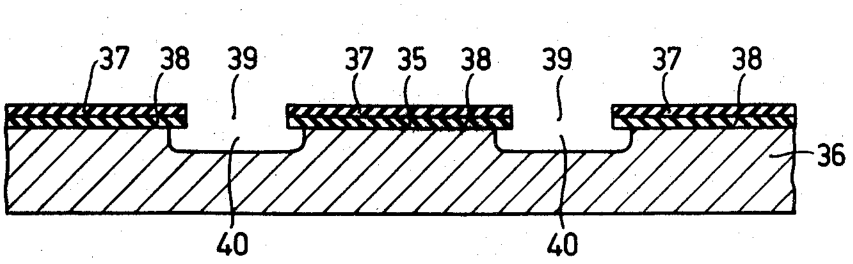
FIG. 3 is a diagrammatic cross-sectional view of a part of a semiconductor device of the type mentioned in the preamble in an early stage of the manufacture.

In manufacturing the semiconductor device described, an oxidation-resistant masking layer 37, 38 having apertures 39 at the area where the inset pattern is to be formed is provided on the major surface 35 (see FIG. 3) of a semiconductor body of silicon.

It will now be described how in certain processes to obtain the inset pattern shortcircuit may occur between regions of the circuit element to be formed in the semiconductor body.

Figure 4:
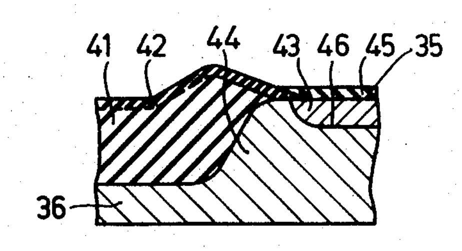
FIG. 4 is a diagrammatic cross-sectional view of a detail of the part shown in FIG. 3 in a later stage of the manufacture.

The masking layer 37, 38 often consists of a silicon oxide layer 38 and a silicon nitride layer 37. After providing the apertures 39 in the masking layer, recesses 40 are etched in the semiconductor body. During the oxidation of the silicon body 36 at the area of the recesses 40, oxidation occurs also at the edge of the apertures below the silicon oxide layer 38, as a result of which an inset oxide pattern is formed after the removal of the masking layer 37, 38, the shape of the edge 41 of which pattern is shown in FIG. 4.

If in a usual manner a shallow region 43 of the p-type is diffused in the n-type layer-shaped part 44 via the major surface 35, an oxide layer 45 is also formed at the major surface 35. Upon removing the oxide layer 45, the part 42 shown in broken lines of the inset oxide pattern 41 may also be removed. It will be obvious from the Figure that the p-n junction 46 may be exposed so that in a subsequent diffusion of a doping material to obtain an n-type region shortcircuit occurs between said region and the original layer-shaped part 44. In the method according to the invention, the short-circuit described is prevented in that the semiconductor body 36 is subjected to a treatment in which a doping material which can cause the second conductivity type in the semiconductor body 36 is diffused in a zone 61 adjoining the pattern 41.

Figure 5:
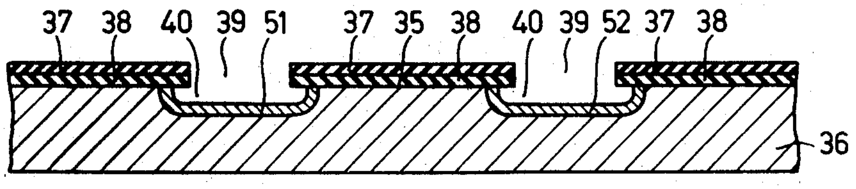
FIGS. 5 and 6 are diagrammatic cross-sectional views of the part shown in FIG. 3 and a detail thereof, respectively, in later successive stages of manufacture by means of the method according to the invention.
Figure 6:
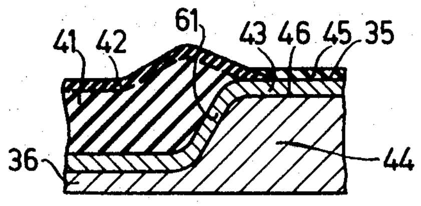

In a variation of the method according to the invention, such a shortcircuit is preferably prevented in that the masking layer 37, 38 is used, prior to the oxidation, for masking during diffusion of the doping material which can cause the p-conductivity type in the semiconductor body 36 to obtain a doping pattern 51, 52 (see FIG. 5), after which the masking layer is used for masking during oxidation of the doping pattern 51, 52 to obtain the inset pattern 41 and the adjoining zone 61 of the p-conductivity type (see FIG. 6).

In this method the p-n junction 46 is not exposed upon removing the oxide layer 45. In another variation of the method according to the invention, the above-described shortcircuit is prevented in that after the formation of the inset pattern 41 by oxidation, the zone 61 of the p-type adjoining the pattern 41 is obtained by diffusion of aluminum or gallium as a doping material which can cause the p-type.

For reasons of simplicity the shape details of the inset oxide pattern are shown in FIGS. 4 and 6 only.

Figure 7:
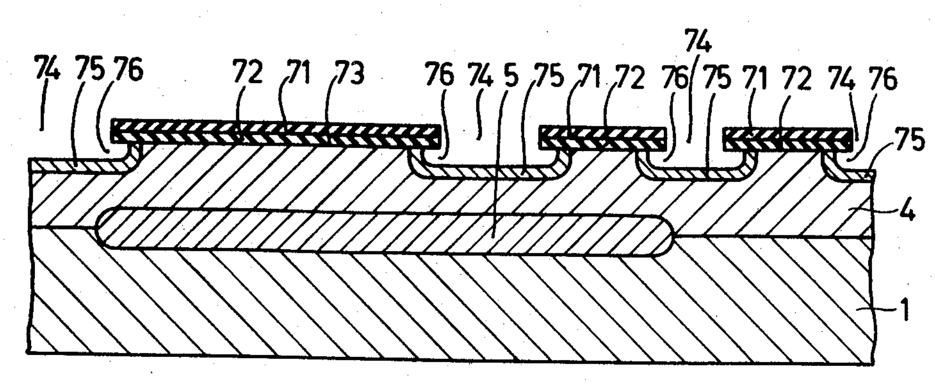
FIGS. 7 and 8 are diagrammatic cross-sectional views of the part shown in FIG. 1 in successive stages of manufacture by means of the method according to the invention.

The structure shown in FIG. 1 can be manufactured as follows by means of the method according to the invention. Starting material is a p-type semiconductor body 1 in the form of a silicon wafer having a thickness of 200 $\mu$ and a resistivity of 2 ohm.cm and serving as a substrate on which an n type arseniccontaining epitaxial layer 4 having a thickness of 2 $\mu$ and a resistivity of 0.5 ohm.cm is deposited (see FIG. 7). A low ohmic n-type region 5 having a maximum concentration of arsenic of $5.10^{19}$ atoms/ccm is formed in a usual manner in the epitaxial layer and the remaining substrate part of the semiconductor body, for example, by the local deposition, prior to the epitaxy, on the semiconductor body of an arsenic source which during the subsequent epitaxial process diffuses both in the semiconductor body and in the epitaxial layer while forming the low-ohmic n-type region 5.

An oxidation-resistant masking layer 71, 72 consisting of a silicon nitride layer 71 of 0.2 $\mu$ thickness and a silicon oxide layer 72 of 0.05 $\mu$ thickness having apertures 74 are then provided on a major surface 73.

The masking layer 71, 72 is first used for etching the silicon body in which approximately 1 $\mu$ deep recesses 76 are formed and is then used for the diffusion of boron in the epitaxial layer 4 to obtain the doping pattern 75. For that purpose a boron source is formed in a usual manner by heating for 5 minutes at 975°C in a boron oxide-containing vapour current. The masking layer 71, 72 is then used to mask during oxidation (see FIG. 8) of the doping pattern 75 to obtain the 2.2 $\mu$ deep inset pattern (6, 7, 8), which extends slightly deeper in the semiconductor body 1 than the thickness of the epitaxial layer 4, and the approximately 1.5 $\mu$ deep adjoining zone 11, 12, 13 of the p-type having a boron concentration of approximately $5.10^{17}$ atoms/ccm. The oxidation is carried out by passing steam of 1 atmosphere over the silicon body for 16 hours at 1,000°C after which the masking layer 71, 72 is removed.

The semiconductor device shown in FIG. 1 can now be obtained in a simple manner since diffusion of doping materials to obtain the regions 3 and 17 (for example simultaneously) and the region 2 may be carried out without it being necessary for masks to be aligned accurately relative to the inset pattern. By a usual diffusion process, the region 3 has, for example, an average concentration of boron of $10^{18}$ atoms/ccm and is 1 $\mu$ deep. The region 2 has a concentration of phosphorus of $10^{20}$ atoms/ccm and is 0.6 $\mu$ deep. In the layer part 14, the other region 4, 5 can be contacted by a deep diffusion of phosphorus with $10^{20}$ atoms/ccm. Herewith it is also achieved that no separate mask need be used for diffusing the regions 3 and 17.

The regions of the circuit element and the semiconductor body can be contacted at the major surface of the semiconductor body via contact zones.

In a corresponding manner, a semiconductor device as shown in FIG. 2 can be manufactured. This device also has the advantages of simple alignment steps together with the pressure of channel stoppers between circuit elements in adjacent layer-shaped parts or between regions in a circuit element.

Figure 8:
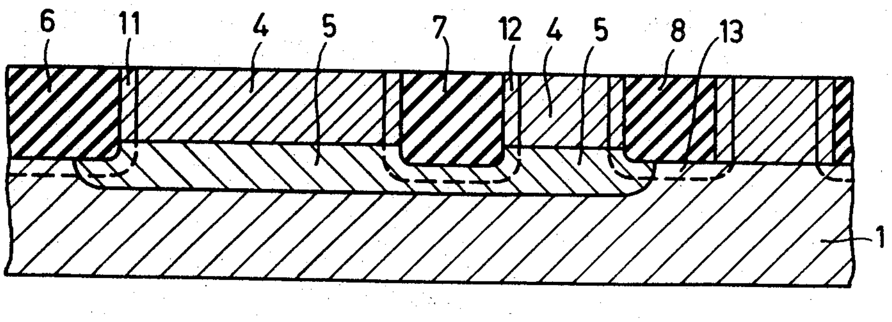

The structure shown in FIG. 8 may also be manufactured by forming the inset pattern 6, 7, 8 after providing the masking layer 71, 72 (see FIG. 7) and not providing the doping pattern 75. Gallium or aluminum is then diffused, for example, while using the masking layer 71,72.

In the case of diffusion of aluminum, the silicon body is provided in a tray of aluminum oxide, which can be closed with an aluminum oxide lid, An alloy of 10 percent by weight of aluminum with 90 percent by weight of silicon is contained in the tray. Upon heating at 1,000°C for 60 minutes in a stream of hydrogen, aluminum is diffused in the silicon body over a depth of approximately 1$\mu$.

In the case in which gallium is diffused, silicon powder is used which contains $10^{18}$ atoms gallium per ccm and heating is carried out in vacuum at 1,100°C for 20 minutes. The diffusion depth of the gallium is also approximately 1$\mu$.

By diffusion of gallium or aluminum the zone 11, 12, 13 of the p-type adjoining the pattern is formed, the maximum concentration of the doping material in the zone is in both diffusion processes $5.10^{17}$ atoms/ccm. Aluminum or gallium is preferably diffused after the masking layer 71, 72 has been removed. The advantage of this is that first the one region of the first conductivity type and the region of the second conductivity type can be obtained by diffusion. These latter two diffusion treatments might disturb an already obtained diffusion profile of the rather rapidly diffusing gallium.

Therefore, gallium or aluminum is preferably diffused after the one region of the first conductivity type has been formed in the semiconductor body.

In a further preferred embodiment, the adjoining zone and the region of the opposite conductivity type are formed simultaneously in the semiconductor body. This saves a diffusion step.

Diffusion of Al or Ga may of course also be used to obtain the structure shown in FIG. 2.

It will be obvious that the invention is not restricted to the embodiments described. For example, instead of the p-type semiconductor body described in the embodiments, the starting material may be an n-type semiconductor body. The semiconductor bodies may be provided with p-type epitaxial layers instead of with n-type epitaxial layers. Instead of etching recesses prior to the oxidation described, the oxidation may also be carried out in the two steps, in which the formed oxide is removed after the first step. The circuit element may be, for example, a p-n-p-n transistor. The inset pattern may also be inset only partly in the semiconductor body, which is the case, for example, when the oxidation is not interrupted by a step in which the already formed oxide is removed or when the body is not etched previously to oxidation.

Instead of a silicon nitride layer, the masking layer may comprise an aluminum oxide layer.

In all the cases, space-saving structures may be obtained for the manufacture of which special alignement steps can often be avoided.

What is claimed is:

1. In a method of making a semiconductor device comprising a semiconductor body having at a major surface an inset pattern of insulating material forming at least one layer-shaped, surface body part adjoining the inset pattern along its entire circumference and throughout its entire thickness, and having at least one circuit element with at least first and second regions of a first conductivity type separated by a third region of a second conductivity type with said first and third regions being located entirely in said one layer-shaped body part and said second region having at least a part located in said one layer-shaped body part and said second region part adjoining the inset pattern along its entire circumference, and having said third region adjoining the inset pattern along at least a part of its circumference and being separated from the major surface at least in part by the first region, in which an additional doped zone is provided adjacent to the inset pattern, the steps comprising prior to provision of the inset pattern, providing an oxidation and impurity masking layer pattern on the major surface and with apertures over the semiconductor body portions at the areas where the inset pattern is to be formed, introducing second type forming impurities into the body through the apertures while the oxidation and impurity masking layer protects the body parts between the apertures to form the said additional zone, and thereafter oxidizing the body portions through the apertures while the oxidation masking layer protects the body parts between the apertures to form the inset pattern, the impurity introduction and oxidation steps being such that the additional doped zone which forms borders the whole of the inset pattern and contains a concentration of second type forming impurities which is smaller than the maximum concentration of first type forming impurities in the second region but still sufficiently large to prevent in the semiconductor adjacent the inset pattern undesired electrical connections between spaced first type regions.

2. A method as claimed in claim 1 wherein the second-type forming impurities are introduced by diffusion.

3. A method as claimed in claim 2 wherein prior to the diffusion step grooves are formed in the semiconductor bdoy at the areas where the second type impurities are to be diffused.

4. In a method of making a semiconductor device comprising a semiconductor body having at a major surface an inset pattern of insulating material forming at least one layer-shaped, surface body part adjoining the inset pattern along its entire circumference and throughout its entire thickness, and having at least one circuit element with at least first and second regions of a first conductivity type separated by a third region of a second conductivity type with said first and third regions being located entirely in said one layershaped body part and said second region having at least a part located in said one layer-shaped body part and said second region part adjoining the inset pattern along its entire circumference, and having said third region adjoining the inset pattern along at least a part of its circumference and being separated from the major surface at least in part by the first region, in which an additional doped zone is provided adjacent to the inset pattern, the steps comprising providing an oxidation masking layer pattern on the major surface and forming the inset pattern by oxidizing the exposed surface portions, and thereafter diffusing aluminum or gallium as second type forming impurities into the structure, the inset pattern being substantially transparent to the aluminum or gallium whereby the additional doped zone that forms borders the entire inset pattern and contains a concentration of second type forming impurities which is smaller than the maximum concentration of first type forming impurities in the second region but still sufficiently large to prevent in the semiconductor adjacent the inset pattern undesired electrical connections between spaced first type regions.

5. A method as claimed in claim 4 wherein after the inset pattern is formed and before the diffusion step, the oxidation masking layer is removed.

6. A method as claimed in claim 5 wherein the aluminum or gallium is diffused after the first region of the first conductivity type has been formed in the semiconductor body.

7. A method as claimed in claim 5 wherein the additional zone and the third region of the second conductivity type are formed simultaneously in the semiconductor body.

* * * * *

PO-1050
(5/69)

UNITED STATES PATENT OFFICE
CERTIFICATE OF CORRECTION

Patent No. 3873383 Dated March 25, 1975

Inventor(s) ELSE KOOI

It is certified that error appears in the above-identified patent and that said Letters Patent are hereby corrected as shown below:

The Heading should have included the following:

"[30] Foreign Application Priority Data

April 3, 1971 Netherlands . . . . . . . .7104496" --.

Signed and sealed this 24th day of June 1975.

(SEAL)
Attest:

RUTH C. MASON
Attesting Officer

C. MARSHALL DANN
Commissioner of Patents
and Trademarks